(12) United States Patent
Schumann

(10) Patent No.: US 10,053,655 B2
(45) Date of Patent: Aug. 21, 2018

(54) PHOTORESIST STRIPPING USING INTELLIGENT LIQUIDS

(71) Applicant: intelligent fluids GmbH, Leipzig (DE)

(72) Inventor: Dirk Schumann, Leipzig (DE)

(73) Assignee: INTELLIGENT FLUIDS GMBH, Leipzig (DE)

( * ) Notice: Subject to any disclaimer, the term of this patent is extended or adjusted under 35 U.S.C. 154(b) by 0 days.

(21) Appl. No.: 15/028,452

(22) PCT Filed: Oct. 13, 2014

(86) PCT No.: PCT/EP2014/071915
§ 371 (c)(1),
(2) Date: Apr. 11, 2016

(87) PCT Pub. No.: WO2015/052347
PCT Pub. Date: Apr. 16, 2015

(65) Prior Publication Data
US 2016/0230130 A1    Aug. 11, 2016

(30) Foreign Application Priority Data

Oct. 11, 2013 (DE) .................. 10 2013 016 870

(51) Int. Cl.
| | | |
|---|---|---|
| *C11D 17/00* | (2006.01) | |
| *C11D 11/00* | (2006.01) | |
| *C11D 3/20* | (2006.01) | |
| *C11D 3/32* | (2006.01) | |
| *C11D 1/14* | (2006.01) | |
| *C11D 1/75* | (2006.01) | |
| *C11D 1/83* | (2006.01) | |
| *H01L 21/027* | (2006.01) | |
| *H01L 21/3105* | (2006.01) | |
| *H01L 21/321* | (2006.01) | |

(52) U.S. Cl.
CPC .......... *C11D 11/0047* (2013.01); *C11D 1/146* (2013.01); *C11D 1/75* (2013.01); *C11D 1/83* (2013.01); *C11D 3/2041* (2013.01); *C11D 3/2044* (2013.01); *C11D 3/2072* (2013.01); *C11D 3/2075* (2013.01); *C11D 3/2093* (2013.01); *C11D 3/32* (2013.01); *C11D 17/0013* (2013.01); *C11D 17/0017* (2013.01); *H01L 21/0272* (2013.01); *H01L 21/31058* (2013.01); *H01L 21/321* (2013.01)

(58) Field of Classification Search
CPC .... C11D 11/0047; C11D 17/0021; C11D 3/43
USPC ....................................................... 510/417
See application file for complete search history.

(56) References Cited

U.S. PATENT DOCUMENTS

| | | | | |
|---|---|---|---|---|
| 6,130,195 A | * | 10/2000 | Doyel ................. | C11D 3/2068 510/174 |
| 6,544,942 B1 | * | 4/2003 | Smith .................... | A01N 25/02 510/365 |
| 2011/0229424 A1 | * | 9/2011 | Schumann ............... | A61K 8/06 424/62 |
| 2012/0073607 A1 | * | 3/2012 | Quillen ................... | C09D 4/06 134/19 |
| 2014/0011359 A1 | * | 1/2014 | Klipp ...................... | C11D 1/72 438/692 |

* cited by examiner

*Primary Examiner* — Gregory E Webb
(74) *Attorney, Agent, or Firm* — RatnerPrestia

(57) ABSTRACT

The invention present describes novel cleaning agents based on a multiphase system, the use thereof for removing photoresist coatings from surfaces, and a method for removing photoresist coatings from surfaces. The multiphase system according to the invention is used in particular for removing coatings, photoresist coatings, polymer layers, dirt layers, insulation layers, and metal layers from surfaces.

18 Claims, No Drawings

PHOTORESIST STRIPPING USING INTELLIGENT LIQUIDS

The present invention describes novel cleaning agents based on a multiphase system, the use thereof for removing photoresist coatings from surfaces, and a method for removing photoresist coatings from surfaces.

The multiphase system according to the invention is used in particular for removing coatings, photoresist coatings, polymer layers, dirt layers, insulation layers, and metal layers from surfaces.

The manufacture of a silicon chip starts with a plate-sized silicon wafer made of silicon monochrystals. The wafers are approximately 1 mm thick. Circuits, lines, and electronic components are built up layer by layer on these wafers. The manufacture takes place in several hundred process steps, depending on the particular product desired, and some of the steps are repeated multiple times.

In order to apply the desired structures to the silicon surface of the wafer, the surface is initially oxidized with steam. The oxide layer allows structuring of the surface by chemical reaction, using fluorochemistry.

A photoresist is subsequently applied. The photoresist is transferred via a mask by means of lithographic methods. Photoresists are used in microelectronics and microsystem technology for producing structures in the micron and submicron range, and in printed circuit board manufacture. In chemical terms, these are mixtures of prepolymers or polymers based on methyl methacrylate, novolaks, polymethyl glutarimide, or epoxy resins, together with solvents and a photosensitive component.

There are two basic types of photoresists:

The so-called negative resist polymerizes by illumination, and optionally by subsequent thermal stabilization, so that after developing, the illuminated areas remain. The unilluminated areas, which are protected via a mask, remain soluble, and are removed with solvents or with alkaline solutions. The negative photoresists are used primarily in microsystem technology for producing extremely small structures in the micron and submicron range.

For the positive resists, due to the illumination the already polymerized coating once again becomes partially soluble (depolymerizes) for appropriate developer solutions. The remaining portions of the photoresist protect the portions of the silicon or silicon dioxide surface which are not to be changed, while chemical modification is possible at the exposed locations. In this way, the silicon dioxide may be removed via an etching step, using hydrofluoric acid or $CF_4$, or the free silicon may be doped by ion bombardment.

The described operations of coating, illumination, stripping, and etching are often repeated multiple times, using different masks.

The fields of application of the wet chemical methods may be classified as follows:

Wet etching:
Refers to removal of doped and undoped oxide layers over all or part of the surface.

Wafer cleaning:
Particles, organic and metallic substances, and the natural oxide layer of the silicon surface must be continuously removed.

Coating removal:
After the structure beneath the coating has been ablated in the etching process, or the coating has been used as a masking layer during the implantation process, the coating must be removed.

Metal lift-off:
A special form of coating removal in which in addition, a metal layer applied to the coating must also be removed.

Backside treatment:
Removal of layers that have developed on the backsides of the wafers during oven processes.

Polymer removal:
Removal of by-products which arise during plasma etching and collect on the wafer disks.

Cleaning operations are thus essential for the manufacture of microchips. Thus far, however, the full scope of the above-mentioned types of cleaning has not been addressed in an approach to solving the problem.

One of the most important, constantly recurring cleaning operations is removal of the photoresist. The photoresist must be removed after it has been used as a masking layer.

This takes place in two different ways in the prior art: dry plasma ashing, or wet chemical stripping of the coating, for example with the aid of flammable solvents such as acetone. However, as part of process reliability, and with particular consideration to the flash point issue, there is an ever-increasing search for input materials which are able to remove the photoresists with the same speed as acetone. The difficulty lies in the fact that the higher the flash point of the solvent, the slower the removal of photoresists. Another problem is that only slightly crosslinked photoresists may be removed with this method. The solubility of the coatings decreases drastically with increasing crosslinking.

Highly crosslinked or even implemented photoresists (after doping) are so difficult for solvents to remove that they must be removed by etching steps or plasma ashing. However, plasma ashing disadvantageously results in incomplete resist removal; i.e., after the ashing, a further, and thus additional, wet chemical cleaning step is generally carried out. In addition, the ashing takes place at high temperatures, resulting in material stress such as deformation, thermal stress, and so forth of complicated components made of different materials having different coefficients of expansion. Furthermore, radical combustion products may attack the substrate surface before the aggressive radicals recombine. As a result, destruction of small structures may occur.

The complex process technology for radical generation, the necessary controlled process management, and disposal of materials also result in high costs.

For metal lift-off as well, it is difficult to strip layers from the substrate. This method is a standard process in the manufacture of microelectronic components, sensors, or lasers. In addition to the photoresist coating, a continuous metal layer must also be stripped.

The degree of automation is correspondingly high. Common machines attain a wafer throughput of up to 80 units per hour. There are batch as well as single wafer processes. In addition, there is a combination of both, which predominates on the market. The stripper is brought to the desired temperature (85° C. for NMP, for example) in a heatable basin. The photoresist is solubilized, dissolved, or stripped during a specified soaking time (approximately 10 to 30 minutes). In a subsequent step, each wafer is individually withdrawn from the bath and subjected to a single wafer process. The residues of the photoresist, of the stripper, and of the metal layer are discharged. The purity of the surface is increased in further rinsing steps, for example using IPA, demineralized water, or the like.

For the cleaning processes within the microelectronics field, there is therefore a great need for more effective cleaning agents which are more protective of the environment, health, and the substrate.

The object of the present invention, therefore, is to provide such agents and to use such agents for removing photoresist coatings, for example, from surfaces.

These agents are intended to be used as a replacement for the highly aggressive and thus critical cleaning agents. The use of biodegradable, toxicologically and dermatologically acceptable ingredients would also result in savings in the areas of disposal and work protection. In addition to the safety-relevant aspects, the aim is for the novel cleaning agents to achieve process optimization with regard to time and procedures. It is thus advantageous to dispense with process steps, for example the wet step after the plasma ashing.

The object is achieved according to the invention by a multiphase system comprising two immiscible liquids, one of the liquids being water or a substance similar to water, and the other of the two liquids being a water-insoluble substance having a solubility of less than 4 g/L in water, additionally containing at least one surfactant, amphiphiles besides the substances to be associated with the surfactants, and optionally additives and/or auxiliary materials, the multiphase system being characterized in that it has a turbidity characteristic greater than 0 to 200 NTU.

The Nephelometric Turbidity Unit (NTU) is a unit used in water treatment for turbidity measurements of liquids. It is the unit of the turbidity of a liquid which is measured with a calibrated nephelometer.

According to one embodiment of the present invention, the surfactant used is a nonionic, cationic, anionic, or amphoteric surfactant.

Surfactants within the meaning of the present invention are substances which lower the surface tension of a liquid or the interfacial tension between two phases, and allow or facilitate the formation of dispersions/emulsions or act as solubilizers. Under the action of surfactants, two liquids which in fact are immiscible with one another, such as oil and water, may be finely blended (dispersed). Surfactants form a typical micelle structure; i.e., above a certain concentration they form fairly large, loose structures, which in the present context is referred to as "structure-forming." Surfactants within the meaning of the invention have an oriented structure, wherein one portion generally is composed of a hydrophobic, water-repellent carbon moiety and the other portion is composed of a hydrophilic, water-tolerant part of the molecule.

Examples of surfactants within the meaning of the invention include but are not limited to higher alcohols, in particular those with hydrophilic-lipophilic molecular portions, such as n- and iso-isomers of butanol, pentanol, hexanol, heptanol, octanol, nonanol, decanol, undecanol, and dodecanol, or the modified derivatives thereof in the hydrophobic and/or hydrophilic part of the molecule.

For example, alkali or ammonium salts of long-chain fatty acids, alkyl(benzene) sulfonates, paraffin sulfonates, bis(2-ethylhexyl)sulfosuccinate, and alkyl sulfates, primarily sodium dodecyl sulfate, may be used as anionic surfactants, and for special applications, for example involving corrosion protection, alkyl phosphates (for example, Phospholan® PE 65, Akzo Nobel) may sometimes be used.

Polyalkylene oxide-modified fatty alcohols, for example Berol® types (Akzo-Nobel) and Hoesch® T types (Julius Hoesch), alkylethoxylates, in particular selected from C9-C13 n-alkyl-ethoxylates or C9-C19 i-alkyl-ethoxylates, as well as corresponding octyl phenols (triton types) or nonyl phenols (provided that the latter are not released to the environment in large quantities) are usable as nonionic surfactants. In one special field of application, heptamethyltrisiloxanes (for example, Silwet® types, GE Silicones) may be used as agents for greatly increasing the spreading properties of the liquids or for greatly reducing the interfacial tension.

Coco bis(2-hydroxyethyl)methylammonium chloride or polyoxyethylene-modified talc methylammonium chloride, for example, may be used as cationic surfactants. The use of various amphoteric surfactants is also possible. If a broader pH range is to be covered, coco dimethyl amine oxide (Aormox® MCD, Akzo-Nobel) has proven to be suitable.

The surfactants are preferably contained in the multiphase system according to the invention in quantities of 2 to 20% by weight, based on the total weight of the multiphase system.

According to the invention, the water-insoluble substances are those having a solubility in water of less than 4 g/L, preferably less than 2 g/L. These substances should preferably have swelling and/or dissolving properties. Examples include alkanes (gasolines) and cycloalkanes (preferably cyclohexane). Aromatics such as toluene, xylenes, or other alkylbenzenes as well as naphthalenes are also suitable. Long-chain alkanoic acid esters such as fatty oils and fatty acid methyl esters (biodiesel) are preferred. Further preferred are oils, for example esters, succinic acid esters, adipic acid esters, glutaric acid esters as well as di-n-actylether, petroleum ether and p-menthan. According to the invention, benzyl acetate is also included in the water-insoluble substances used. However, terpenes, for example monocyclic monoterpenes with a cyclohexane backbone, may also be used. Terpenes from citrus fruits, such as citrus terpenes and/or orange terpenes, or the limonene contained therein are particularly preferred here. The water-insoluble substances are preferably contained in the multiphase system in quantities of 1.5-30% by weight.

According to one embodiment, it is preferred when the multiphase system has no carbon dioxide, in particular in the form of supercritical $CO_2$.

According to one embodiment, the at least one amphiphile is selected from:

a) diols of formula I:

$$R_1R_2COH—(CH_2)_n—COHR_1R_2 \quad \text{[formula I]}$$

where n may be 0, 1, 2, 3, or 4, $R_1$ and $R_2$ in each case are independently hydrogen or an unbranched or branched $C_1$-$C_3$ alkyl, with the condition that when n=0, $R_1$ cannot be hydrogen, and the diol is not 2-methyl-2,4-pentanediol;

or is selected from 1,3-propanediol, 1,3-butanediol, 1,4-butanediol, 1,5-pentanediol, 1,6-hexanediol, 2,3-butanediol, 2,4-pentanediol, or 2,5-dimethyl-2,5-hexanediol.

b) acetoacetates of formula II:

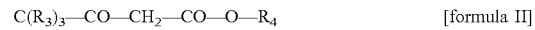

$$C(R_3)_3—CO—CH_2—CO—O—R_4 \quad \text{[formula II]}$$

where $R_3$ in each case is independently hydrogen or a $C_1$ to $C_2$ alkyl, and $R_4$ is a branched or unbranched $C_1$ to $C_4$ alkyl; or acetoacetates of formula III:

$$CH_3-CO-CH_2-CO-O-R_5 \quad \text{[formula III]}$$

where $R_5$ is a $C_1$ to $C_4$ alkyl;
or is selected from ethyl acetoacetate, isopropyl acetoacetate, methyl acetoacetate, n-butyl acetoacetate, n-propyl acetoacetate, or tert-butyl acetoacetate.

c) diones of formula IV:

$$CH_3-(CH_2)_p-CO-(CH_2)_q-CO-(CH_2)_r-CH_3 \quad \text{[formula IV]}$$

where
p, q, r may independently be 0, 1, or 2, with the condition that when the sum of p, q, and r=2, the compound according to formula IV may also be cyclic (cyclohexanedione);
or is selected from 2,3-butanedione (diacetyl), 2,4-pentanedione (acetylacetone), 3,4-hexanedione, 2,5-hexanedione, 2,3-pentanedione, 2,3-hexanedione, 1,4-cyclohexanedione, or 1,3-cyclohexanedione.

d) esters of formula V $$R_6-CO-O-R_7 \quad \text{[formula V]}$$

where
$R_6$ is a ring bond to $R_7$, $CH_3$, or $COCH_3$ and
$R_7$ is a $(CH_2)_2-O-$ ring bond to $R^6$ or a $(CH_2)_2-O-(CH_2)_3-CH_3$, $CH_2-CH_3$, or $CH_2-CH(CH_3)-O-$ ring bond to $R_6$;
or is selected from (1-methoxy-2-propyl) acetate, (2-butoxyethyl) acetate, ethylene carbonate, ethyl pyruvate (2-oxopropionic acid ethyl ester), or propylene carbonate.

e) maleic or fumaric acid amides of formula VI:

$$R_8-HN-CO-C=C-CO-O-R_9 \quad \text{[formula VI]}$$

where
$R_8$ is hydrogen, a branched or unbranched $C_1$-$C_4$ alkyl, or a branched or unbranched, linear or cyclic $C_1$-$C_6$ alkyl, wherein the $C_1$-$C_6$ alkyl is substituted with one or more groups selected from OH, $NH_2$, COOH, CO, $SO_3H$, $OP(OH)_2$, and $R_9$ is hydrogen or a branched or unbranched $C_1$-$C_4$ alkyl;
or is selected from the following maleic acid amides and the methyl, ethyl, propyl, and butyl esters thereof: N-methyl maleamide; N-ethyl maleamide; N-(n-propyl) maleamide; N-(isopropyl) maleamide; N-(n-butyl) maleamide; N-(isobutyl maleamide); N-(tert-butyl maleamide), and the corresponding fumaric acid amides thereof and the methyl, ethyl, propyl, and butyl esters thereof.

f) 2,2-dimethoxypropane, pyruvic acid aldehyde-1,1-dimethylacetal, diacetone alcohol (2-methyl-2-pentanol-4-one), 2-butanol, 2-acetyl-gamma-butyrolactone, 3-amino-1H-1,2,4-triazole, gamma-butyrolactone, nicotinamide, ascorbic acid, N-acetylamino acids, in particular N-acetyl-glycine, -alanine, -cysteine, -valine, or -arginine, triethyl phosphate, n-butyl acetate, dimethylsulfoxide, or 2,2,2-trifluoroethanol.

The amphiphile is particularly preferably selected from acetoacetates of formula III:

$$CH_3-CO-CH_2-CO-O-R_5 \quad \text{[Formula III]}$$

where
$R_5$ is a $C_1$ to $C_4$ alkyl.

A further subject matter of the present invention relates to the use of a multiphase system, as described above, for removing photoresists from surfaces. The surface is a metal surface, preferably a silicon wafer, as known from chip manufacturing. In particular, the surface is a nonmetallic surface, preferably a silicon or glass wafer and/or a metal surface thereon, preferably copper or aluminum. The photoresist is preferably a crosslinked photoresist. The degree of crosslinking is preferably greater than 0.5%, more preferably greater than 1%, even more preferably greater than 5%, even more preferably greater than 10%, and most preferably greater than 25%, based on the crosslinkable groups in the photoresist. In many cases a metal layer is applied to the photoresist. In particular, this involves highly conductive metals, for example gold.

By use of the multiphase system according to the invention, in addition to the photoresist, the metal layer is also easily stripped at the same time. No stripping takes place at locations where the metal layer is in direct contact with the metal surface, for example a silicon wafer. A metal layer thus remains on the metal surface.

A further subject matter of the present invention relates to a method for removing photo(resist) coatings from surfaces, wherein a composition as described above is used.

The surface is a nonmetallic or metal surface, preferably a silicon or glass wafer, as known from chip manufacturing. The metal surface may include copper or aluminum. The photoresist is preferably a crosslinked photoresist. The degree of crosslinking is preferably greater than 0.5%, more preferably greater than 1%, even more preferably greater than 5%, even more preferably greater than 10%, and most preferably greater than 25%, based on the crosslinkable groups in the photoresist. In many cases a metal layer is applied to the photoresist. In particular, this involves highly conductive metal layer, for example a gold layer.

By use of the multiphase system according to the invention, in addition to the photoresist, the metal layer is also easily stripped at the same time. No stripping takes place at locations where the metal layer is in direct contact with the metal surface, for example a silicon wafer. A metal layer thus remains on the metal surface.

The method is carried out by applying the multiphase system to the surface to be treated, and allowing it to act for a period of 30 seconds to 5 hours. The multiphase system is subsequently removed.

The cleaning action of the agents according to the invention lies in infiltration of the paint layer and metal layer, often accompanied by fragmentation of the paint layers and metal layers and stripping thereof from the base surface, wherein in comparison to the prior art, chemical decomposition of the layers is not absolutely necessary, and instead may advantageously be avoided. In addition, physical dissolution is avoided or largely avoided. This is made possible by the multiphase system according to the invention.

The multiphase system according to the invention is therefore very well suited as a replacement for the previously known highly aggressive and thus critical cleaning agents. The use of biodegradable, toxicologically and dermatologically acceptable ingredients also results in savings in the areas of disposal and work protection. In addition to the safety-relevant aspects, process optimization with regard to time and procedures may be achieved using the novel cleaning agents. Process steps, for example the wet step after the plasma ashing, may be dispensed with.

The invention is now explained with reference to exemplary embodiments, which are not to be construed as limiting the scope of protection.

EXAMPLE 1

| Ingredient | Weight fraction [% by weight] |
| --- | --- |
| Water, demineralized | 25.20 |
| 1-Methoxy-2-propanol | 18.70 |
| Ethyl acetoacetate | 22.50 |
| Benzyl acetate | 4.80 |
| Benzyl alcohol | 6.70 |
| Fragrance | 0.80 |
| Oil | 7.70 |
| Dodecyl sulfate salt | 7.00 |
| Alkyl ethoxylate | 6.60 |
| Total | 100.00% |

EXAMPLE 2

| Ingredient | Weight fraction [% by weight] |
| --- | --- |
| Water, demineralized | 39.45 |
| Diacetone alcohol | 14.00 |
| Ethyl acetoacetate | 25.00 |
| Oil | 3.00 |
| 2-Phenylethanol | 3.75 |
| Alkyl ethoxylate | 12.00 |
| Dodecyl sulfate salt | 2.80 |
| Total | 100.00% |

EXAMPLE 3

| | |
| --- | --- |
| Water, demineralized | 34.0% |
| 1,2-Propanediol | 8.0% |
| Dipropylene glycol monomethyl ether | 14.0% |
| Ethyl acetoacetate | 12.5% |
| Dibasic ester, for example IMSOL R | 7.2% |
| Benzyl alcohol | 6.5% |
| Benzyl lactate | 4.6% |
| Orange oil (Aurantii dulcis aetheroleum) | 0.9% |
| n-Butyl maleamide | 2.2% |
| Ethanolamine | 0.8% |
| Ethoxylated Guerbet alcohol (LUTENSOL XL 60, for example) | 6.2% |
| Lauramine oxide | 3.1% |
| Total | 100% |

All multiphase systems show a turbidity value in the range of greater than 0 to less than or equal to 200 NTU. The turbidity value may be maintained over a wide temperature range of 10 to 95° C. The determination of the turbidity value may be carried out very easily with a turbidimeter, for example a Hach 2100 Turbidimeter, and is known to those skilled in the art.

The invention claimed is:

1. A multiphase system comprising two immiscible liquids, one of the liquids being water or a substance similar to water, and the other of the two liquids being a water-insoluble substance having a solubility of less than 4 g/L in water, and additionally containing at least one surfactant and optionally additives and/or auxiliary materials, wherein the multiphase system has a turbidity value greater than 0 to less than or equal to 200 NTU, wherein the water-insoluble substance is present in an amount ranging from 1.5-30% by weight relative to the total weight of the multiphase system and the at least one surfactant is present in an amount ranging from 2-20% by weight relative to the total weight of the multiphase system.

2. The multiphase system according to claim 1, wherein the surfactant is a cationic, anionic, nonionic, or amphoteric surfactant.

3. The multiphase system according to claim 1, wherein the water-insoluble substance is selected from the group comprising alkanes, cycloalkanes, aromatics, long-chain alkanoic acid esters, esters of di- or tricarboxylic acids, terpenes, or the mixtures thereof.

4. The multiphase system according to claim 1, wherein one or more amphiphiles are also contained in the multiphase system.

5. The multiphase system according to claim 1, wherein at least one of the amphiphiles is selected from:

a) diols of formula I:

$$R_1R_2COH—(CH_2)_n—COHR_1R_2 \quad \text{[formula I]}$$

wherein n may be 0, 1, 2, 3, or 4, $R_1$ and $R_2$ in each case are independently hydrogen or an unbranched or branched $C_1$-$C_3$ alkyl, with the condition that when n=0, $R_1$ cannot be hydrogen, and the diol is not 2-methyl-2,4-pentanediol;

or is selected from 1,3-propanediol, 1,3-butanediol, 1,4-butanediol, 1,5-pentanediol, 1,6-hexanediol, 2,3-butanediol, 2,4-pentanediol, or 2,5-dimethyl-2,5-hexanediol;

b) acetoacetates of formula II:

$$C(R_3)_3—CO—CH_2—CO—O—R_4 \quad \text{[formula II]}$$

wherein $R_3$ in each case is independently hydrogen or a $C_1$ to $C_2$ alkyl, and $R_4$ is a branched or unbranched $C_1$ to $C_4$ alkyl;

or acetoacetates of formula III:

$$CH_3—CO—CH_2—CO—O—R_5 \quad \text{[formula III]}$$

wherein $R_5$ is a $C_1$ to $C_4$ alkyl;

or is selected from ethyl acetoacetate, isopropyl acetoacetate, methyl acetoacetate, n-butyl acetoacetate, n-propyl acetoacetate, or tert-butyl acetoacetate;

c) diones of formula IV:

$$CH_3—(CH_2)_p—CO—(CH_2)_q—CO—(CH_2)_r—CH3 \quad \text{[formula IV]}$$

wherein p, q, r may independently be 0, 1, or 2, with the condition that when the sum of p, q, and r=2, the compound according to formula IV may also be cyclic (cyclohexanedione);

or is selected from 2,3-butanedione (diacetyl), 2,4-pentanedione (acetylacetone), 3,4-hexanedione, 2,5-hexanedione, 2,3-pentanedione, 2,3-hexanedione, 1,4-cyclohexanedione, or 1,3-cyclohexanedione;

d) esters of formula V:

$$R_6—CO—O—R_7 \quad \text{[formula V]}$$

wherein $R_6$ is a ring bond to $R_7$, $CH_3$, or $COCH_3$ and $R_7$ is a $(CH_2)_2$—O— ring bond to $R_6$ or a $(CH_2)_2$—O—$(CH_2)_2$—$CH_3$, $CH_2$—$CH_3$, or $CH_2$—CH$(CH_3)$—O— ring bond to $R_6$;

or is selected from (1-methoxy-2-propyl) acetate, (2-butoxyethyl) acetate, ethylene carbonate, ethyl pyruvate (2-oxopropionic acid ethyl ester), or propylene carbonate;

e) maleic or fumaric acid amides of formula VI:

   [formula VI]

wherein $R_8$ is hydrogen, a branched or unbranched $C_1$-$C_4$ alkyl, or a branched or unbranched, linear or cyclic $C_1$-$C_6$ alkyl, wherein the $C_1$-$C_6$ alkyl is substituted with one or more groups selected from OH, $NH_2$, COOH, CO, $SO_3H$, $OP(OH)_2$, and $R_9$ is hydrogen or a branched or unbranched $C_1$-$C_4$ alkyl;

or is selected from the following maleic acid amides and the methyl, ethyl, propyl, and butyl esters thereof: N-methyl maleamide; N-ethyl maleamide; N-(n-propyl) maleamide; N-(isopropyl) maleamide; N-(n-butyl) maleamide; N-(isobutyl maleamide); N-(tert-butyl maleamide), and the corresponding fumaric acid amides and the methyl, ethyl, propyl, and butyl esters thereof;

f) acids and the ammonium salts and amine salts thereof, and the amides thereof, in particular of cinnamic acid and cinnamic acid salts, and g) 2,2-dimethoxypropane, pyruvic acid aldehyde-1,1-dimethylacetal, diacetone alcohol (2-methyl-2-pentanol-4-one), 2-butanol, 2-acetyl-gamma-butyrolactone, 3-amino-1H-1,2,4-triazole, gamma-butyrolactone, nicotinamide, ascorbic acid, N-acetylamino acids, in particular N-acetylglycine, -alanine, -cysteine, -valine, or -arginine, triethyl phosphate, n-butyl acetate, dimethylsulfoxide, or 2,2,2-trifluoroethanol.

6. The multiphase system according to claim 1, wherein the amphiphile is selected from acetoacetates of formula III:

   [formula III]

wherein $R_5$ is a $C_1$ to $C_4$ alkyl.

7. A method for removing photoresist coatings from surfaces comprising providing a surface having a photoresist coating thereon and applying a composition according to claim 1 to the photoresist coating.

8. The method according to claim 7, wherein the surface is a metal surface.

9. The method according to claim 7, wherein the photoresist is a crosslinked photoresist.

10. A method for removing metal layers from photoresist coatings comprising providing a metal layer on a surface having a photoresist and applying a composition according to claim 1 to the metal layer.

11. The method according to claim 10, wherein the metal layer on the photoresist is stripped using the multiphase system.

12. The method according to claim 10, wherein the metal layer remains on the surface.

13. The method according to claim 7, wherein the multiphase system is applied to the photoresist to be treated and acts for a period of 30 seconds to 5 hours.

14. The method according to claim 13, wherein the multiphase system is removed.

15. The method according to claim 7, wherein the surface is a silicon or glass wafer and/or a metal surface thereon.

16. The method according to claim 15, wherein the metal is copper or aluminum.

17. The method according to claim 10, wherein the surface is a silicon or glass wafer and/or a metal surface thereon.

18. The method according to claim 17, wherein the metal is copper or aluminum.

* * * * *